(12) United States Patent
Lin et al.

(10) Patent No.: US 9,514,988 B1
(45) Date of Patent: Dec. 6, 2016

(54) SEMICONDUCTOR DEVICES AND PACKAGING METHODS THEREOF

(71) Applicant: Taiwan Semiconductor Manufacturing Company, Ltd., Hsin-Chu (TW)

(72) Inventors: Shih Ting Lin, Taipei (TW); Szu-Wei Lu, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/803,211

(22) Filed: Jul. 20, 2015

(51) Int. Cl.
*H01L 21/16* (2006.01)
*H01L 21/82* (2006.01)
*H01L 21/683* (2006.01)
*H01L 21/324* (2006.01)
*H01L 23/00* (2006.01)

(52) U.S. Cl.
CPC .......... *H01L 21/82* (2013.01); *H01L 21/324* (2013.01); *H01L 21/6831* (2013.01); *H01L 21/6836* (2013.01); *H01L 24/83* (2013.01); *H01L 24/97* (2013.01); *H01L 2224/83815* (2013.01)

(58) Field of Classification Search
CPC .... H01L 21/82; H01L 21/324; H01L 21/6831; H01L 21/6836; H01L 24/83; H01L 24/97; H01L 2224/83815
See application file for complete search history.

(56) References Cited

U.S. PATENT DOCUMENTS

| | | | | |
|---|---|---|---|---|
| 2013/0037802 | A1* | 2/2013 | England | H01L 21/568 257/48 |
| 2013/0168848 | A1* | 7/2013 | Lin | H01L 24/19 257/737 |
| 2014/0051232 | A1* | 2/2014 | Burghout | H01L 21/02076 438/460 |
| 2015/0270237 | A1* | 9/2015 | Chi | H01L 23/528 257/737 |

* cited by examiner

*Primary Examiner* — Shaun Campbell
(74) *Attorney, Agent, or Firm* — Slater Matsil, LLP (57) ABSTRACT

Packaged semiconductor devices and methods of packaging thereof are disclosed. In some embodiments, a method of packaging semiconductor devices comprises attaching a first substrate to a film. A first portion of the film is attached to a first region of the first substrate and a second portion of the film is attached to a second region of the first substrate. The method further comprises separating the first portion of the film from the second portion of the film.

20 Claims, 13 Drawing Sheets

SEMICONDUCTOR DEVICES AND PACKAGING METHODS THEREOF

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., 3D integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (PoP) devices are one type of 3DIC wherein dies are partially packaged and are then packaged together with another partially packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packaged semiconductor devices and methods of packaging semiconductor devices are disclosed in the present disclosure. In an embodiment, a wafer comprises a plurality of bottom packages, and each of the bottom packages has a plurality of external connectors formed on a first side of the wafer. The external connectors on the wafer and inactive regions on the first side of the wafer are attached to a tape mounted on a frame. Prior to a reflow process to bond a plurality of top packages with the bottom packages, a center portion of the tape attached to the external connectors on the wafer is removed. The disclosed methods provide many advantages, such as no sticky tape residue on external connectors and no solder ball deformation after reflow. The disclosed methods can be used with a singulation tool with a chuck to save a second tape and its mounting process, thus reducing material cost and processing time.

Figure 1A:
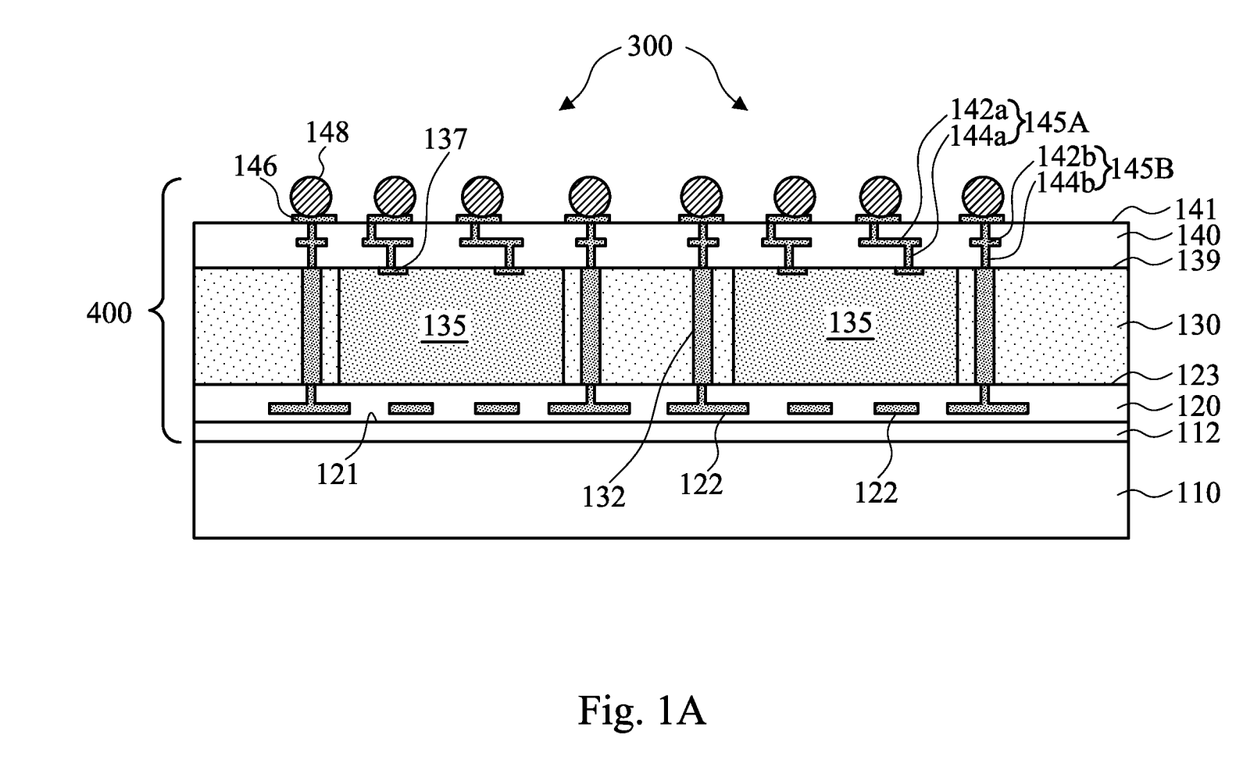
FIGS. 1A and 2-9 are cross-sectional views illustrating a method of packaging semiconductor devices at various stages in accordance with some embodiments.

FIGS. 1A and 2-9 are cross-sectional views illustrating a method of packaging semiconductor devices at various stages in accordance with some embodiments. Illustrated in FIG. 1A is a structure comprising a substrate or wafer 400 formed on a carrier 110. Substrate/wafer 400 is referred to as wafer 400 hereinafter. Wafer 400 comprises a plurality of IC devices 300, in some embodiments. Each IC device 300 comprises an IC die 135, back-side redistribution layer (BSRDL) 120, front-side redistribution layer (FSRDL) 140, molding compound 130, vias 132, and external connectors 148, in accordance with some embodiments. Although FIG. 1A only shows two IC devices 300 for illustration purpose, one skilled in the art will appreciate that wafer 400 may comprise dozens of, hundreds of, or even more IC devices 300. Factors determining the number of IC devices 300 in a wafer 400 include the size (e.g., area) of wafer 400 and the size (e.g., area) of IC die 135, as examples. The size of IC die 135 is determined by the type of the IC (e.g., digital IC, analog IC or mixed-signal IC), complexity of the IC (e.g., gate counts), the manufacturing process (e.g., 90 nm, 45 nm, or 10 nm process technologies), and other factors, for example.

As illustrated in FIG. 1A, wafer 400 is formed on a carrier 110 in some embodiments. Carrier 100 may comprise glass, silicon oxide, aluminum oxide, or a semiconductor wafer, as examples. Carrier 110 may also comprise other materials. Carrier 110 may be circular, square, or rectangular in a top view, as examples. Alternatively, carrier 110 may comprise other shapes.

A film 112 is formed on carrier 110, in some embodiments. Film 112 may comprises a polymer material, in some embodiments. In other embodiments, film 112 may comprise a light-to-heat conversion (LTHC) material or other materials. The LTHC film 112 comprises a thickness of about 0.5 μm to about 3 μm, for example. Alternatively, film 112 may comprise other dimensions. In some other embodiments, film 112 is not included.

A back-side redistribution layer (BSRDL) 120 of IC device 300 is formed on film 112, in some embodiments. The BSRDL 120 may comprise one or more layers of conductive lines and vias (not shown) formed in one or more dielectric layers. The one or more dielectric layers may be formed, for example, of dielectric material, such as phosphosilicate glass (PSG), borophosphosilicate glass (BPSG), fluorinated silicate glass (FSG), SiOxCy, spin-on-glass, spin-on-polymers, silicon carbon material, low dielectric constant (low-K) dielectric materials, compounds thereof, composites thereof, combinations thereof, or the like, by any suitable method, such as spinning, CVD, and/or plasma-enhanced CVD (PECVD). The conductive lines and conductive vias may comprise copper, copper alloys, other metals or alloys, or combinations or multiple layers thereof, as examples. The conductive lines and conductive vias may be formed using subtractive and/or damascene techniques, as examples. The conductive lines and conductive vias may be formed using one or more sputtering processes, photolithography processes, and plating processes, as examples. In accordance with an embodiment, redistribution conductive pads 122 are formed in the dielectric material proximate an outer surface 121 of BSRDL 120. Redistribution conductive pads 122 may be part of one or more conductive layers that include metal lines and vias (not shown) in BSRDL 120, for example. In embodiments where film 112 is not included, BSRDL 120 may be formed on carrier 110.

As illustrated in FIG. 1A, the inactive sides of IC dies 135 are attached to an upper surface 123 of BSRDL 120 by a glue layer or a die attach film (DAF) (not shown), in some embodiments. IC dies 135 comprise a plurality of active and/or inactive electrical components such as transistor, resistors, diodes, inductors, and capacitors formed in or on a semiconductor substrate and connected by a plurality of conductive lines and vias to perform certain designed functionalities. For example, IC die 135 might be a signal processing chip, a memory chip, a digital logic chip, or a power management chip. Methods for fabrication of IC dies are well known in the art and details are not repeated here for brevity.

As illustrated in FIG. 1A, molding compound 130 is formed on upper surface 123 of BSDRL 120 and on IC dies 135. The molding compound 130 protects IC dies 135 from outside environment such as moisture and physical impact. The molding compound 130 is applied using a wafer level molding process in some embodiments. The molding material 130 may be molded using, for example, compressive molding, transfer molding, or other methods. The molding material 130 may comprise an epoxy, an organic polymer, a polymer with or without a silica-based or glass filler added, or other materials, as examples. In some embodiments, the molding material 130 comprises a liquid molding compound (LMC) that is a gel type liquid when applied. The molding material 130 may also comprise a liquid or solid when applied. Alternatively, the molding material 130 may comprise other insulating and/or encapsulating materials. After the molding material is applied, a curing process is performed to cure the molding material. The curing process may comprise heating the molding material 130 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 130 may be cured using other methods. In some embodiments, a curing process is not included.

As shown in FIG. 1A, vias 132 extend through molding compound 130 and are located outside boundaries of IC dies 135. Vias 132 may be formed before the molding compound 130 is formed, by forming conductive pillars on upper surface 123 of BSRDL 120 that electrically connect to redistribution contact pads 122 in BSRDL 120, then encapsulating the conductive pillars with molding compound 130, in some embodiments. Other methods for forming vias 132 are also possible.

After the molding compound 130 is formed, a planarization process such as a chemical-mechanical process (CMP) may be performed to form a planar upper surface 139 and to expose contact pads 137 on the active sides of IC dies 135.

As illustrated in FIG. 1A, a front side redistribution layer (FSRDL) 140 is formed on upper surface 139 of the molding compound 130 and IC dies 135, in some embodiments. FSRDL 140 comprises one or more layers of conductive lines 142a/142b and vias 144a/144b formed in one or more dielectric layers. The FSRDL 140 may be formed using similar materials and formation methods as those described for BSRDL 120. The conductive lines 142a and vias 144a form interconnect structures 145A that electrically connect IC dies 135 with contact pads 146 formed on upper surface 141 of FSRDL 140. In some embodiments, interconnect structures 145A extend beyond a boundary of IC die 135 (not shown) to enable fan-out for IC devices 300. The conductive lines 142b and vias 144b form interconnect structures 145B, which may or may not be electrically connected with IC dies 150. Interconnect structures 145B electrically connect with vias 132 and redistribution contact pads 122 in BSRDL 120, thus providing easy access to electrical connection for top package 500 (see FIG. 7) in a package-on-package (PoP) structure. Since IC devices 300 are bonded with top packages 500 to form a plurality of PoP packages (see FIG. 7) in accordance with an embodiment of present disclosure, IC devices 300 may also be referred to as bottom packages 300 hereafter.

As illustrated in FIG. 1A, external connectors 148 are formed on contact pads 146 of FSRDL 140, in accordance with some embodiments. The external connectors 148 may comprise a eutectic material such as solder, for example. The eutectic material may comprise solder balls or solder paste in some embodiments that is reflowed by heating the eutectic material to a melting temperature of the eutectic material. The external connectors 148 are attached using a ball mount process or other process. The eutectic material is then allowed to cool and re-solidify, forming the connectors 148. The external connectors 148 may include other types of electrical connectors, such as microbumps, ball grid array (BGA) balls, controlled collapse chip connection (C4) bumps, or pillars, and may include conductive materials such as Cu, Sn, Ag, Pb, or the like. In some embodiments, the connectors 148 are not included on the package.

Wafer 400 is shown herein for illustrative purposes to comprise a plurality of IC dies 135 encapsulated in a molding compound, such as an integrated fan-out wafer. Other embodiments, however, may use other wafer structures. As discussed in greater detail below, the external connectors 148 of the wafer 400 will be connected to a tape, which will be subsequently removed. Accordingly, other embodiments may utilize different wafer structures. For example, in some embodiments, the wafer 400 may be a processed die prior to singulating into individual dies, an interposer, a packaging substrate, a printed circuit board, or the like.

Figure 1B:
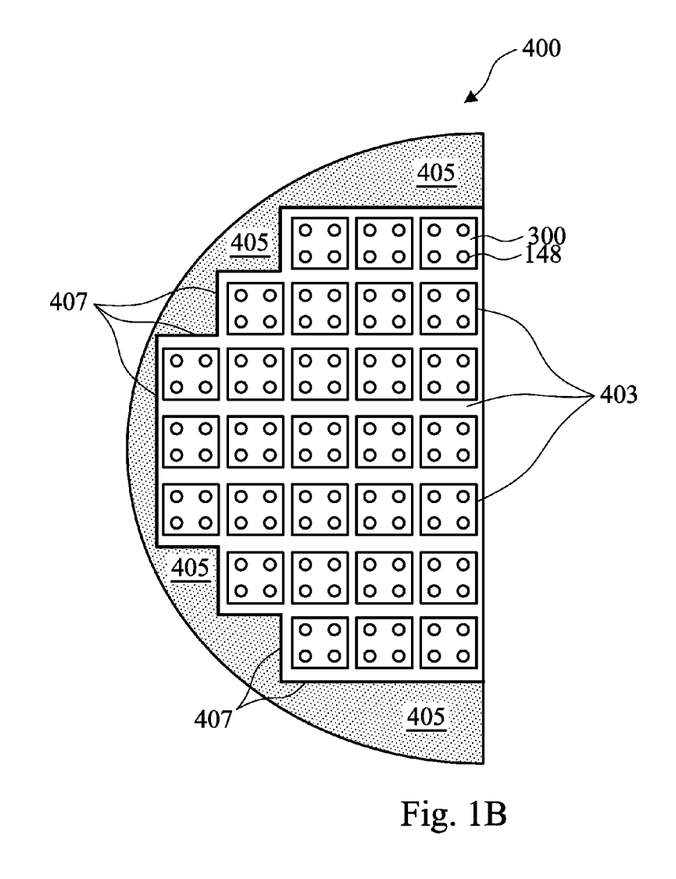
FIG. 1B is a top view of half of a wafer, in accordance with some embodiments.

FIG. 1B illustrates a top view of the active side of half of wafer 400, in accordance with some embodiments. As illustrated in the example of FIG. 1B, wafer 400 comprises die regions 403 comprising rows and columns of IC devices 300 and their associated through vias 132, and each IC device 300 typically occupies a rectangular or square area. External connectors 148 are formed on the active side of each IC device 300. For simplicity, only four connectors are illustrated for IC devices 300 in FIG. 1B, skilled artisan will appreciate that more or less than four external connectors can also be formed for each IC device 300.

The shaded areas 405 in FIG. 1B represent perimeter regions of wafer 400 that are too small to fit in an IC device 300, thus no IC device 300 is formed in areas 405, which is referred to as inactive regions of wafer 400 hereinafter. As illustrated in FIG. 1B, a boundary 407 between die regions 403 and inactive regions 405 of wafer 400 is illustrated by multiple segments of thick lines.

Figure 2:
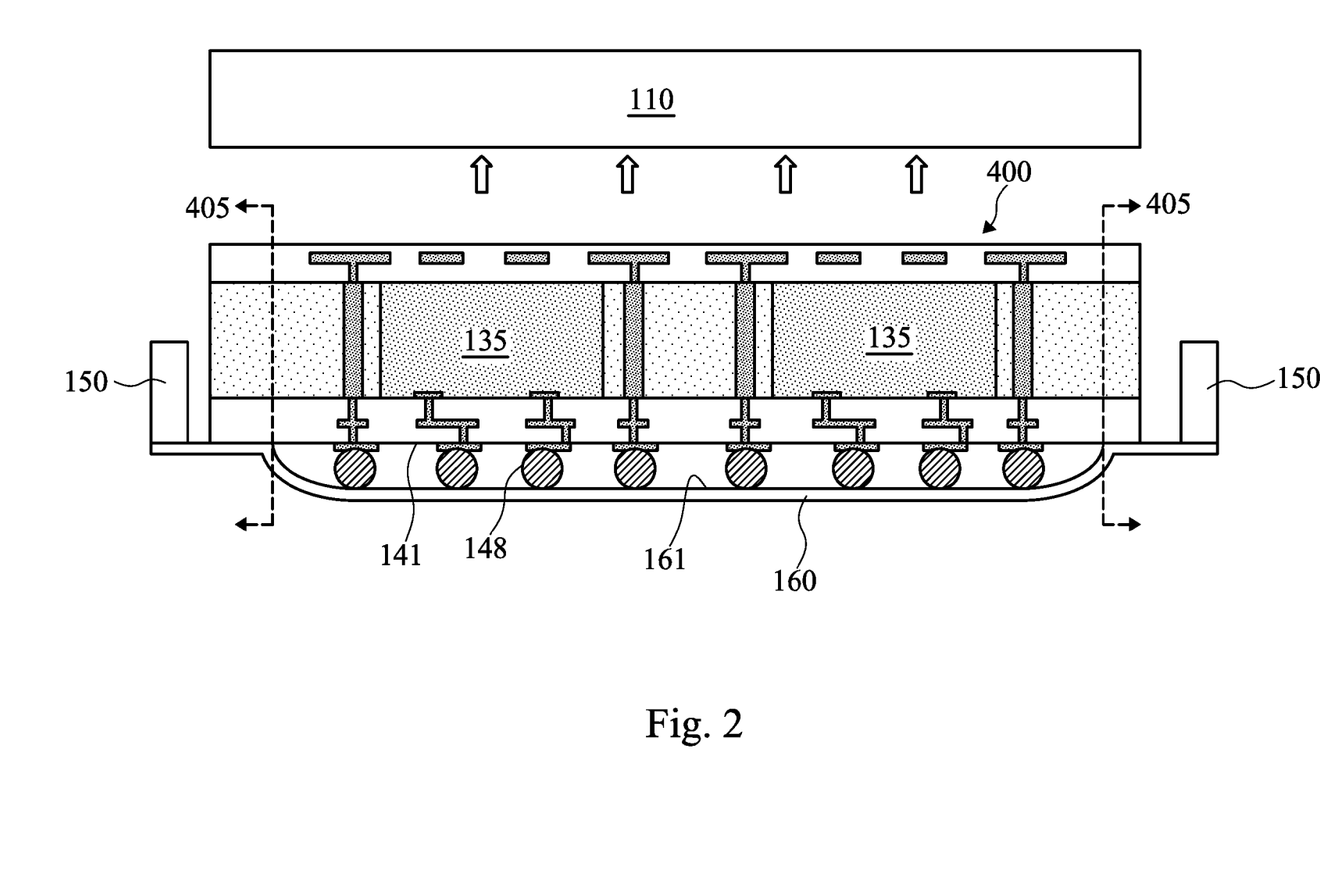

Referring now to FIG. 2, the structure shown in FIG. 1A is flipped over and attached to film 160, which is supported by a support 150, in some embodiments. Film 160 may be a dicing tape and support 150 may be a metal frame, for example. Film 160 has a thickness in a range from about 5 Å to about 300 Å, in some embodiments. In other embodiments, film 160 has a thickness smaller than about 5 Å or larger than about 300 Å, depending on factors such as the size of external connectors 148. As shown in the example of FIG. 2, external connectors 148 on wafer 400 are attached to film 160. The inactive regions 405 of wafer 400 do not have external connectors 148 formed thereon, thus film 160 is attached to upper surface 141 of wafer 400 in inactive regions 405.

After attaching wafer 400 to film 160, a de-bonding process is performed to remove carrier 110 from wafer 400, as illustrated in FIG. 2. Carrier 110 may be de-bonded by chemical wet etching, plasma dry etching, mechanical peel-off, CMP, mechanical grinding, thermal bake, laser scanning, or wet stripping. In some embodiments, carrier 110 is a glass carrier and is de-bonded by a laser de-bonding process. Ultraviolet light emitted by an excimer laser goes through the glass and is absorbed near the glass/adhesive interface, penetrating only a few hundred nanometers and leaving the semiconductor chips in the package unaffected, in some embodiments. The ultraviolet light initiates a photochemical process that directly breaks the chemical bonds in the adhesive layer (not shown). As a result, the glass carrier can be easily separated from wafer 400. In embodiments where a film 112 is formed on carrier 110, the film 112 is also removed in the de-bonding process (not shown).

Figure 3:
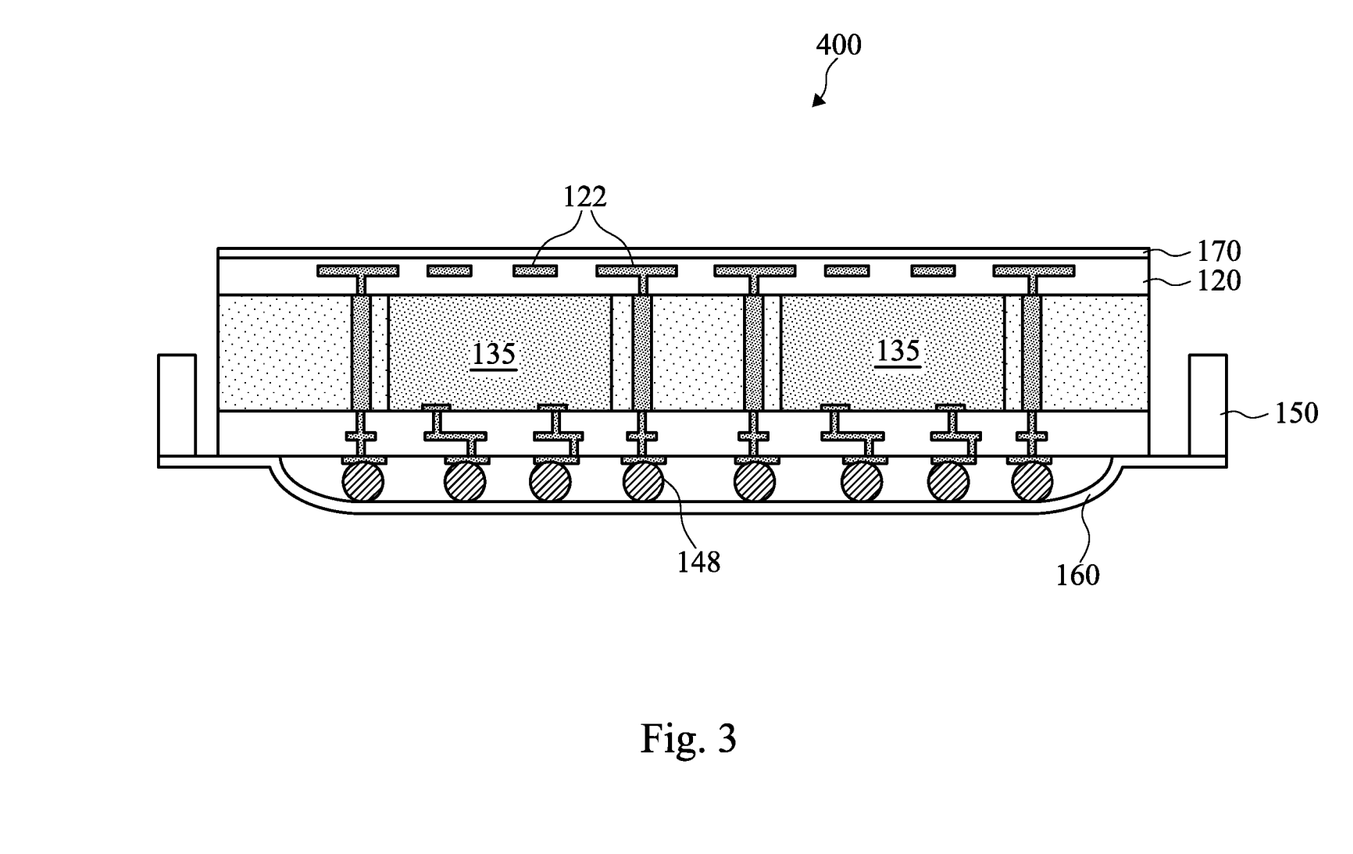

As illustrated in FIG. 3, after carrier de-bonding, a protective film 170 is formed on BSRDL 120, in some embodiments. The protective film 170 may comprise a back side lamination film, for example. The protective film 170 may comprise about 1 μm to about 100 μm of a lamination coating (LC) tape or DAF, as examples. The protective film 170 is formed using a laminating process in some embodiments. The protective film 170 may also comprise other materials, dimensions, and formation methods. In some embodiments, the lamination film 170 is not included.

Figure 4:
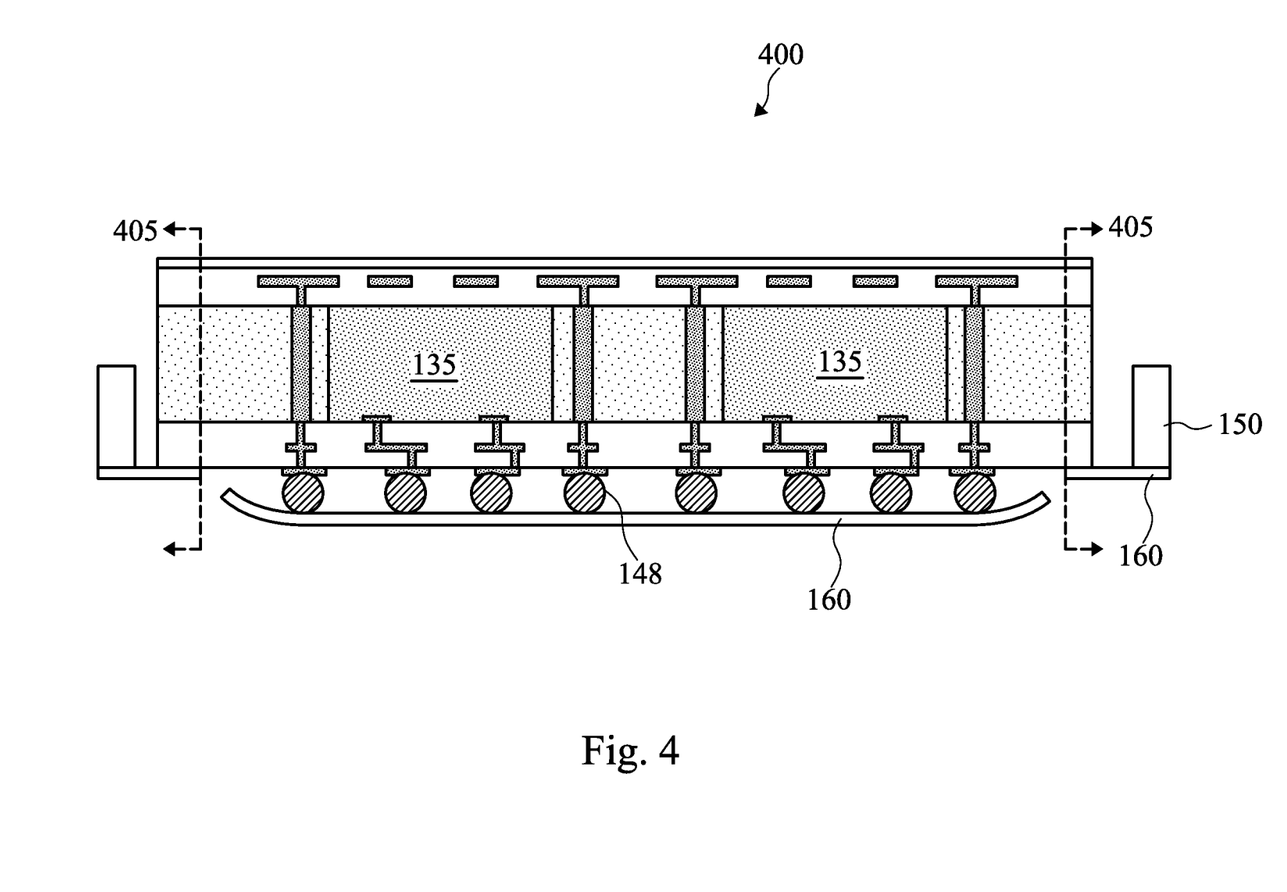

Referring to FIG. 4, in accordance with some embodiments, tape 160 is cut along a boundary 407 (see FIG. 1B) between die regions 403 and inactive regions 405 of wafer 400 using appropriate cutting methods such as a laser cutting machine. The laser used may be a $CO_2$ laser, a UV laser, or a green light laser, in some embodiments. Other types of laser, such as fiber laser and Yttrium-Aluminum-Garnet (YAG) laser, are also contemplated within the scope of the present disclosure. The average output power of the laser is in a range from about 0.1 watt to about 100 watts, in some embodiments. In other embodiments, lasers with average output power lower than 0.1 watt or higher than 100 watts may be used. The average output power of laser is determined by various factors such as the type of materials comprising film 160 (e.g., acrylic, plastic), thickness of film 160, and the maximum cutting speed required.

Referring to FIG. 1B temporarily, laser beam is focused on and moved along boundary 407 between die regions 403 and inactive regions 405 of wafer 400. The movement of laser beam may be achieved by moving the laser head, moving wafer 400, or a combination of both. In some embodiments, a design pattern which defines the location of boundary 407 for wafer 400 is input to the laser cutting machine as, e.g., a digital file. The laser cutting machine's control and motor systems use the design pattern to guide the laser beam to cut film 160 along boundary 407 of wafer 400. In accordance with some embodiments, the laser beam melts, burns or evaporates material of film 160 along boundary 407, and a gas, or mixture of gases, such as oxygen, $CO_2$, nitrogen, and/or helium is used to blow away the vaporized material.

Referring back to FIG. 4. After cutting film 160 along boundary 407 of wafer 400, inactive regions 405 of wafer 400 are still attached to perimeter portions of film 160, thus wafer 400 is held in place by support 150 and perimeter portions of film 160 for subsequent processing.

Figure 5:
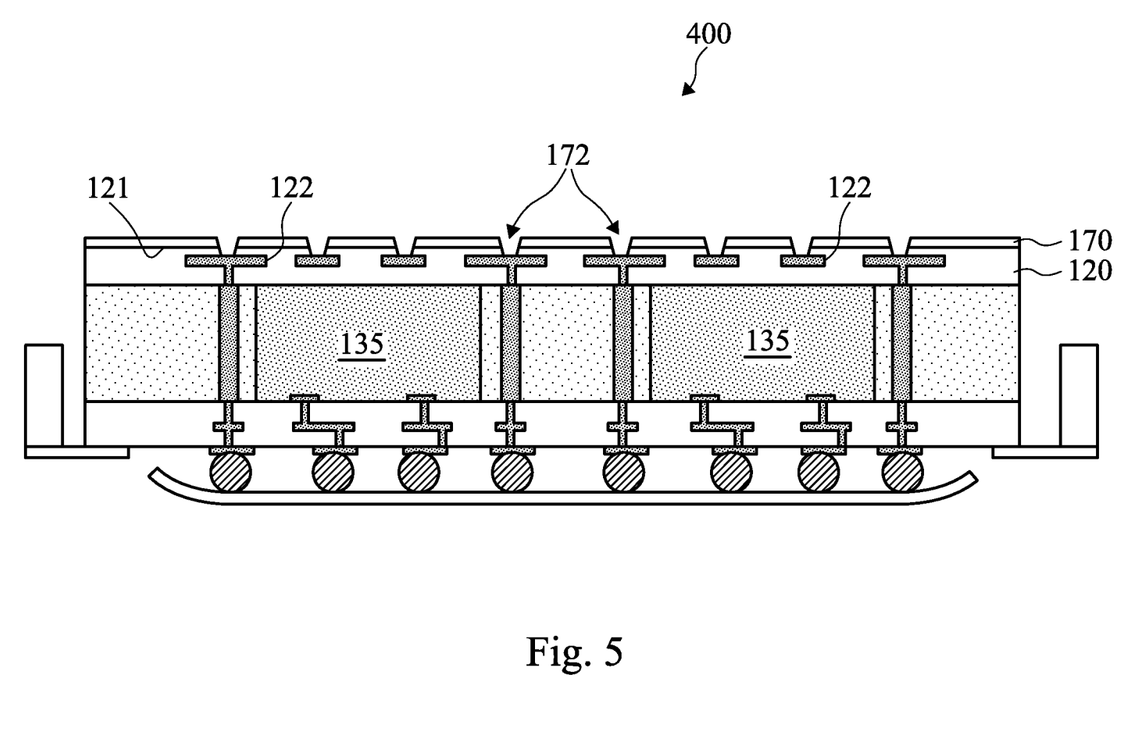

Next, as illustrated in FIG. 5, BSRDL 120 is patterned to expose a top surface of distribution contact pads 122. In embodiments wherein the protective film 170 is included, the protective film 170 is also patterned, as shown in FIG. 5. The openings 172 in BSRDL 120 and protective film 170 may be formed using a lithography/etching process or a direct patterning method, as examples. In accordance with an embodiment of the present disclosure, laser drilling may be used to form openings 172 through protective film 170 and BSRDL120 to expose the top surfaces of distribution contact pads 122.

The openings 172 illustrated in FIG. 5 may be formed before film 160 is cut, in some embodiments. For example, after the structure comprising wafer 400 shown in FIG. 3 is formed, BSRDL 120 and protective film 170 may be patterned to form openings 172 and expose redistribution contact pads 122. Next, film 160 may be cut along boundary 407 of wafer 400 to form the structure shown in FIG. 5.

After openings 172 are formed, a cleaning process is performed to remove residues left during the formation of openings 172. In accordance with some embodiments, a plasma cleaning process is performed using, e.g., $CF_4$, Ar, $O_2$, $N_2$, combinations thereof, or other suitable gases to remove residues. In other embodiments, other cleaning processes, such as a wet cleaning processing, are performed to remove residues from openings 172. For example, wafer 400 may be rinsed in de-ionized (DI) water and dried using a spin dryer or an isopropyl alcohol (IPA) dryer. In other embodiments, wafer 400 may be cleaned using KOH, KMnO$_4$, or other suitable wet cleaning chemicals, as examples.

Figure 6:
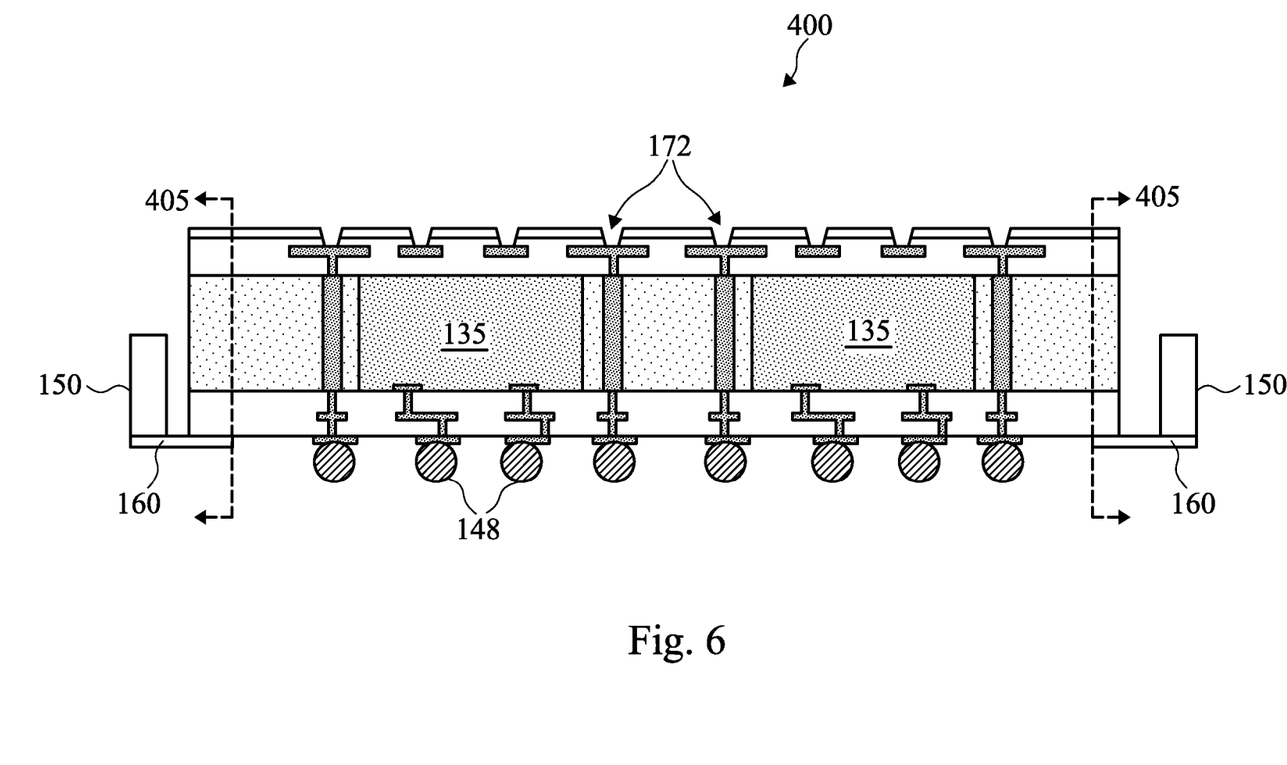

Next, as illustrated in FIG. 6, center portions of film 160, which are attached to external connectors 148 in die regions 403 of wafer 400, are removed. Since the center portions of film 160 are attached to external connectors 148, removal is easily done by, e.g., peeling off the center portions of film 160, in some embodiments. Note that inactive regions 405 of wafer 400 are still attached to the remaining portions of film 160, thus wafer 400 is still held in place by support 150 and the remaining portions of film 160 for subsequent processing. In accordance with some embodiments, a cleaning process may be performed to remove residues left after film 160 is peeled off using, e.g., KOH, hot DI water, combinations thereof, or other suitable cleaning chemicals, as examples.

Figure 7:
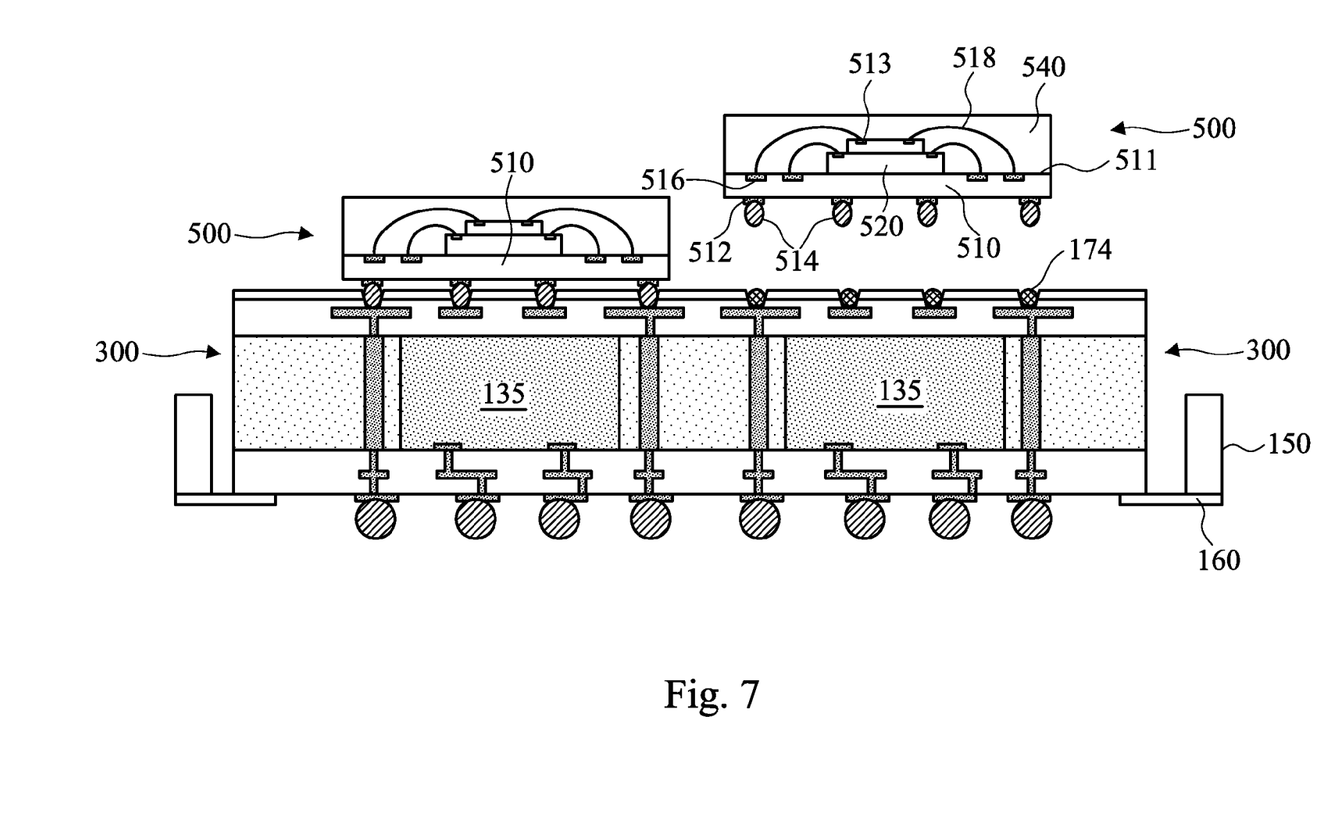

Referring to FIG. 7. Solder paste 174 is formed in openings 172 by a solder printing process using a solder printing machine, in accordance with some embodiments. Alternatively, solder paste 174 may be formed using other suitable methods, such as stenciling. Next, top packages 500 are stacked on top of bottom packages 300. Top packages 500 are aligned with bottom packages 300 so that locations of external connectors 514 of top packages 500 match those of solder paste 174 on bottom packages 300.

As shown in the embodiment of FIG. 7, top package 500 has a semiconductor device 520 mounted on an upper surface 511 of a substrate 510. Semiconductor device 520 is encapsulated by molding compound 540, in some embodiments. Semiconductor device 520 may include one IC die, in some embodiments. Semiconductor device 520 may include a plurality of IC dies stacked together using known methods in the art, in some other embodiments. Substrate 510 includes interconnect structures (not shown), which include one or more layers of metal lines and vias, in accordance with some embodiments. Interconnect structures in substrate 510 connect to contact pads 516 of substrate 510, which are bonded to contact pads 513 of semiconductor device 520 through, e.g. bonding wires 518, and contact pads 512 on opposite side of substrate 510, which are bonded to external connectors 514. In some embodiments, contact pads 516 and 512 comprise aluminum, copper, silver, gold, nickel, tungsten, alloys thereof, and/or multi-layers thereof. External connectors 514 are made of conductive materials such as solder, solder alloy, copper, copper alloy, gold, or gold alloy, etc. External connectors 514 may be bonded to contact pads 512 by a reflow process, as examples.

Figure 8:
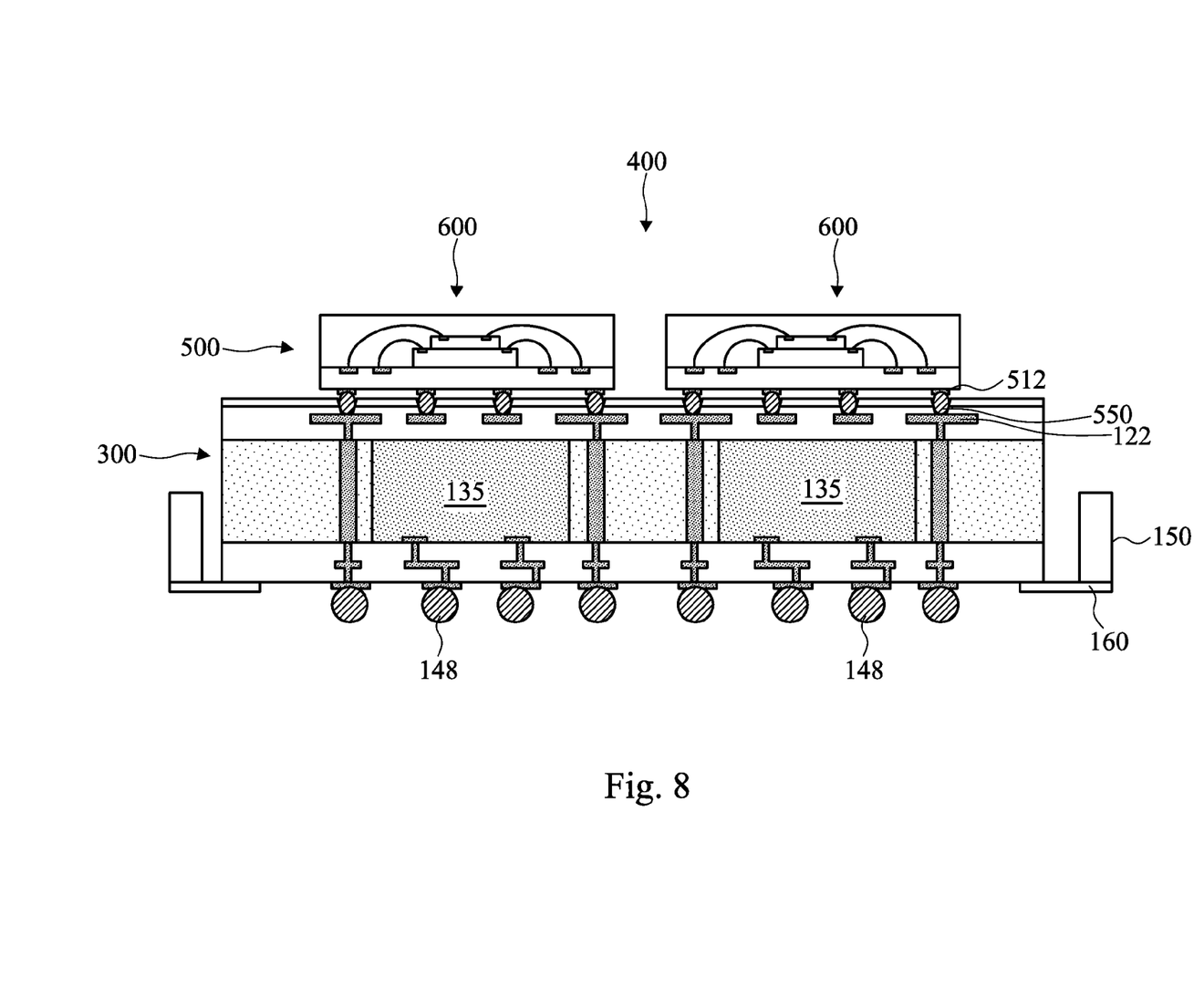

Next, as illustrated in FIG. 8, a reflow process is performed to form inter-package connector 550, and top packages 500 are bonded to bottom packages 300 to form a plurality of un-diced PoP packages 600 in accordance with some embodiments. The reflow process may be performed using, e.g., a reflow oven, infra-red lamp, hot air pencil, or other suitable methods. Solder pastes 174 melt and fuse with external connector 514 of top package 500 to form inter-package connectors 550, in some embodiments. Inter-package connectors 550 may be copper pillars, C4 bumps, or other suitable types of connectors, in accordance with some other embodiments. Inter-package connectors 550 connect redistribution contact pads 122 of bottom package 300 with contact pads 512 of top package 500 to form conductive paths that electrically couple the top package 500 with the bottom package 300, in some embodiments.

In some embodiments, external connectors 148 of bottom package 300 are subject to heat such as the heat during the reflow process. In embodiments where external connectors 148 are, e.g., solder balls, solder balls 148 could melt during the heating process. If center portions of film 160 attached to external connectors 148 were not removed prior to the heating process, the stickiness of film 160 could interfere with the surface tension of the melted solder balls 148 such that when solder balls 148 cool down and re-solidify, it will not retain the original solder ball profile, causing solder ball deformation. The heat from the heating process may also cause film 160 to leave sticky residues on external connectors 148. By removing center portions of film 160 attached to external connectors 148 prior to the subsequent heating process, clean removal of film 160 (e.g., no sticky residues on external connectors 148) is achieved. In addition, external connectors 148 (e.g., solder balls 148) melted during the heating process can regain their original profile when they cool down and re-solidify, thus avoiding solder ball deformation. Although solder balls are used as examples in the discussion above, skilled artisans will appreciate that the discussion applies to other types of external connectors comprising materials that may melt during a heating process, thus the term "solder ball deformation" may also apply to external connectors other than solders balls.

A flux cleaning process (not shown) may be performed to clean the residues from the reflow process, in some embodiments. A solvent, such as the Micronox or Aquanox product from Kyzen Corporation may be used for cleaning. The cleaning process may include stages such as solvent cleaning, water cleaning and wind blowing performed in a cleaning tool for semiconductor manufacturing, in some embodiments.

After the cleaning process, an underfill material (not shown) is formed to fill the gap between top package 500 and bottom package 300, in some embodiments. The underfill material may be dispensed by a capillary dispensing approach using a needle or a jetting dispenser, or other suitable methods, as examples. In some embodiments, the underfill material may completely fill the gap between top package 500 and bottom package 300. In another embodiment, underfill material may partially fill the gap between top package 500 and bottom package 300. The underfill material may be cured under elevated temperature, in some embodiments. Underfill material may provide stress relief for the inter-package connectors 550, in accordance with some embodiments.

Figure 9:
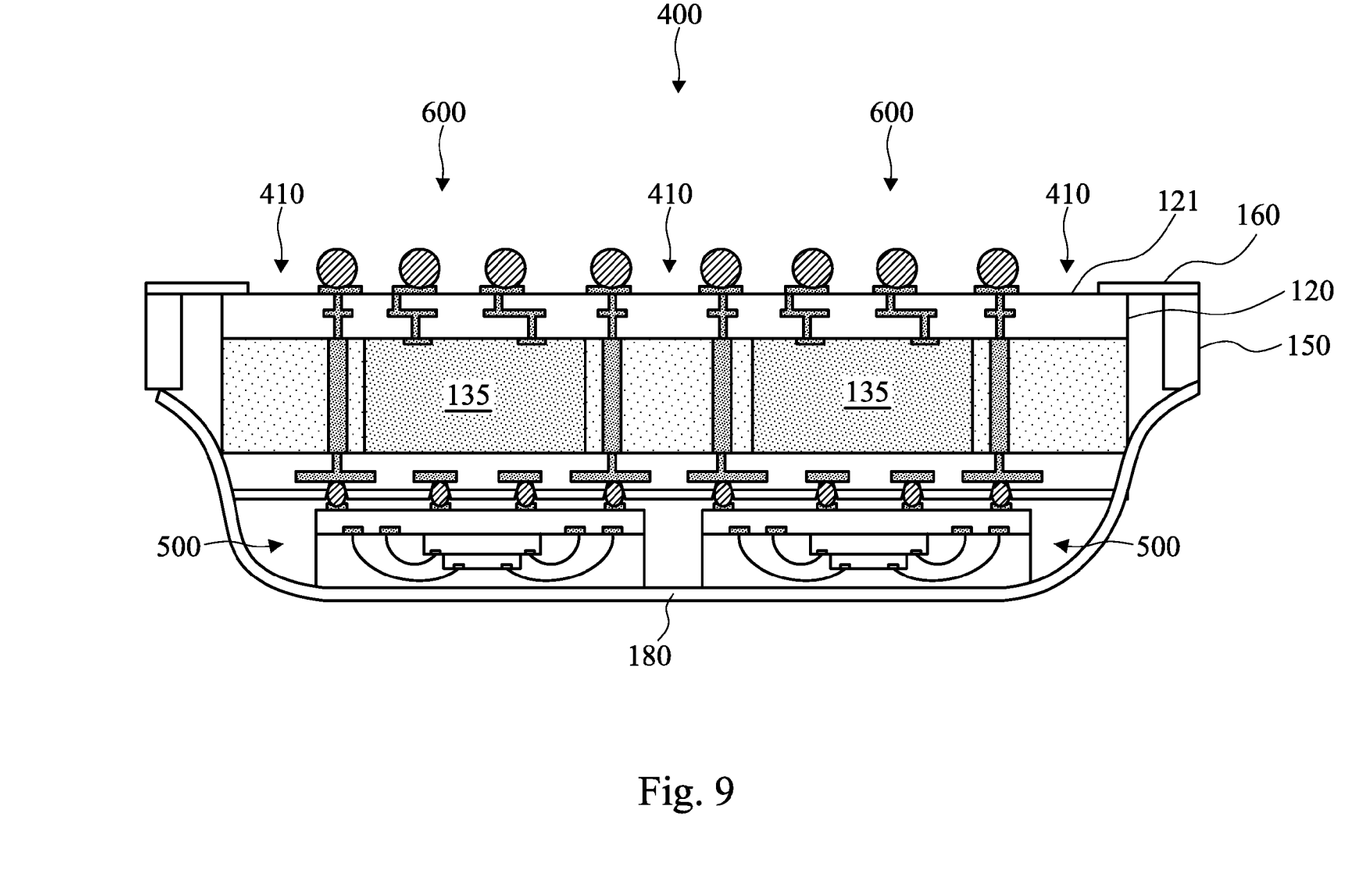

Next, a second film 180 is attached to top packages 500 and mounted on support 150, and wafer 400 is flipped over for dicing along lines 410, as illustrated in FIG. 9, in accordance with some embodiments. The second film 180 is a dicing tape in some embodiments. Since second film 180 is no longer subject to a heating process such as the reflow process described above, second film 180 can use a tape with different heat-resistance requirements from film 160, such as a UV-releasing dicing tape that can be easily released after dicing by exposure to UV radiation, as examples. Dicing is performed using dicing tools such as laser or dicing saw. After dicing, a plurality of individual PoP packages 600 is formed. The film 180 can be easily removed by, e.g., exposing film 180 to UV radiation.

As illustrated in FIG. 9, the perimeter portions of film 160 are still attached to outer surface 121 of wafer 400. These perimeter portions of film 160 are attached to inactive regions 405 of wafer 400 and may be difficult to remove. However, with the presently disclosed methods, the perimeter portions of film 160 may remain, because after dicing, the inactive regions 405 will be separated from individual PoP packages 600. This illustrates another advantage of the presently disclosed methods.

Figure 10:
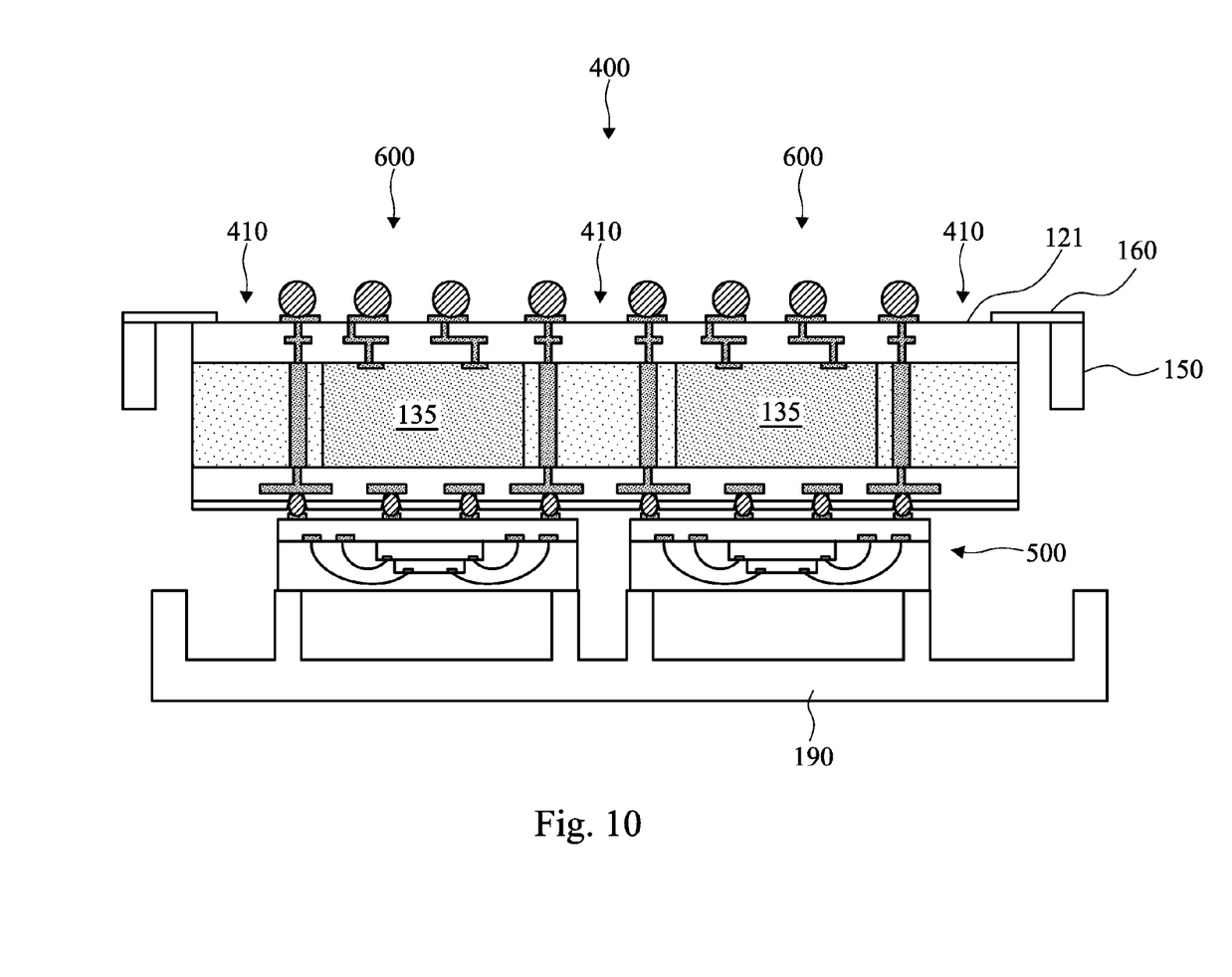
FIG. 10 is a cross-sectional view illustrating processing steps using a chuck, in accordance with some embodiments.
Figure 11:
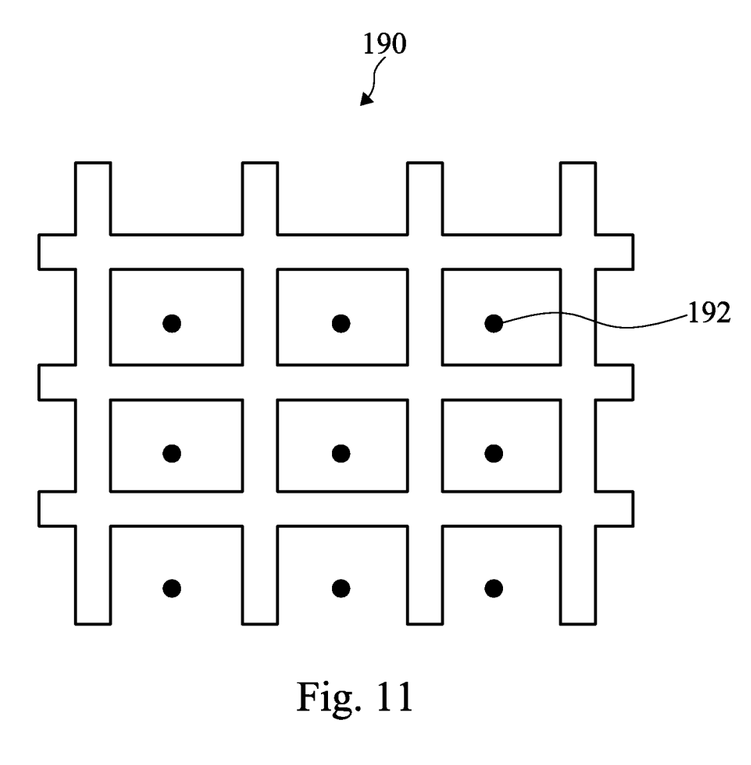
FIG. 11 is a top view of a chuck, in accordance with some embodiments.

FIG. 10 illustrates a dicing process using a chuck 190, which may be used with or without the second film 180 shown in FIG. 9. As shown in FIG. 10, wafer 400 as shown after the processing step shown in FIG. 8 is flipped over, and top packages 500 are attached to a chuck 190 of a singulation tool, in some embodiments. FIG. 11 shows a top view of chuck 190. In some embodiments, chuck 190 comprises a plurality of rectangular or square units formed by upward-extending walls, with each unit matching the size and location of each top package 500 bonded on wafer 400. One or more holes 192 are formed at the bottom of each unit of chuck 190. Air is removed from each unit through holes 192 to form a vacuum, and wafer 400 is held in place by vacuum during dicing. Referring back to FIG. 10, dicing is performed along lines 410 to singulate wafer 400 into a plurality of individual PoP packages 600, in some embodiments. In embodiments where chuck 190 is used without the second film 180 during dicing, the second film 180 and the mounting process to mount second film 180 are saved, thus reducing material cost and processing time. Similar to FIG. 9, in some embodiments, the perimeter portions of film 160 attached to inactive regions 405 of wafer 400 may remain, since the perimeter portions of film 160 will be separated from PoP packages 600 after dicing, thereby reducing processing steps.

Embodiments of the above described processes for forming semiconductor packages may have many advantages. By removing center portions of film 160 that are attached to external connectors before a subsequent heating process such as the reflow process, problems such as solder ball deformation and stick film residues on external connectors are avoided or reduced. Another advantage of the disclosed methods is that it is possible to save the processing step used for removing perimeter portions of film 160 attached to inactive regions of wafer 400, since the perimeter portions of film 160 will separate from individual semiconductor packages after dicing. Using a singulation tool with a chuck, dicing could be performed without the second film 180 and its mounting process, saving material cost and processing time.

Figure 12:
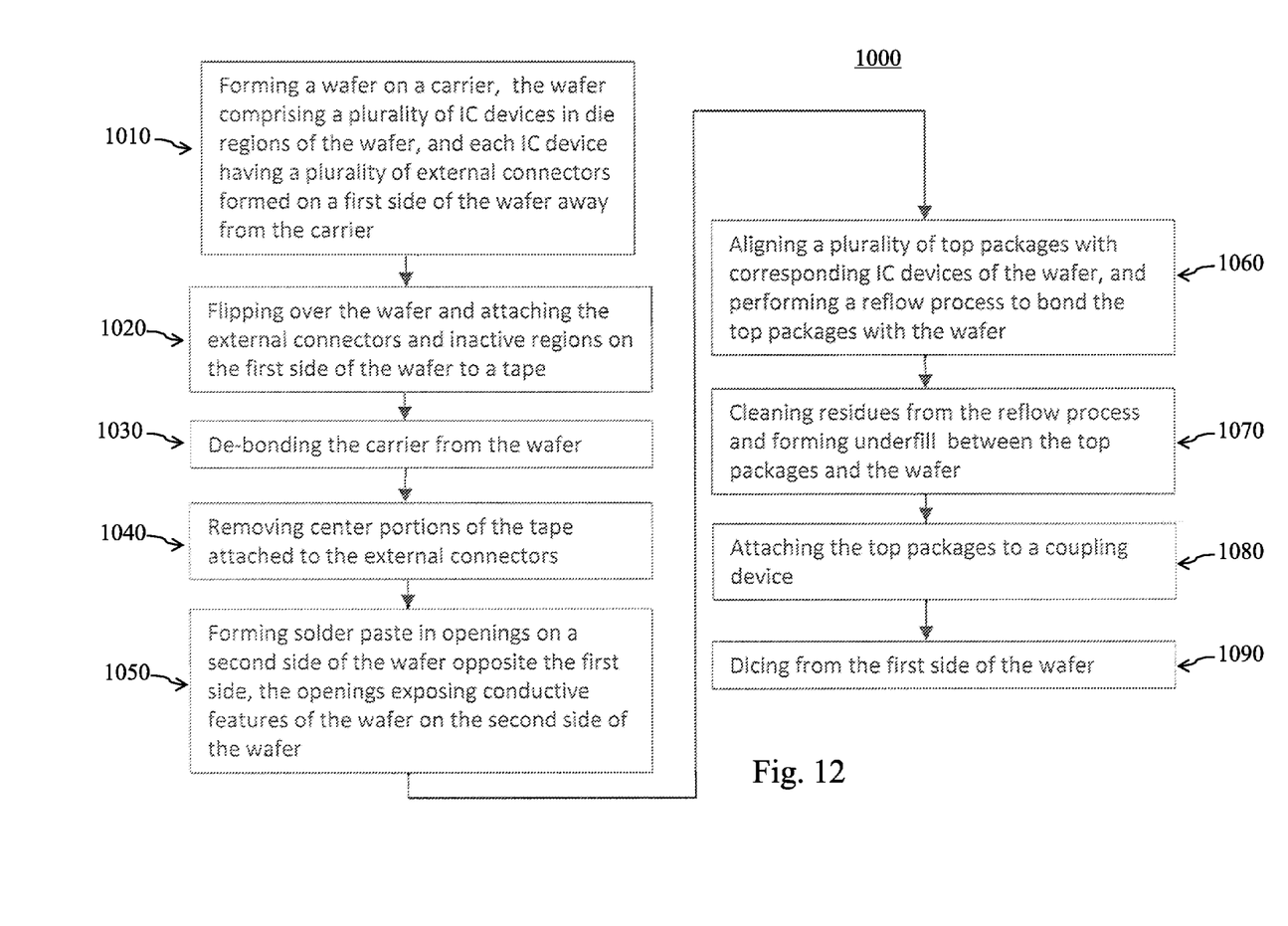
FIG. 12 is a flow chart of a method for forming semiconductor packages, in accordance with various embodiments.

FIG. 12 illustrates a flow chart of a method for forming semiconductor packages, in accordance with various embodiments of the present disclosure. The flowchart shown in FIG. 12 is merely an example, which should not unduly limit the scope of the claims. One of ordinary skill in the art would recognize many variations, alternatives, and modifications. For example, various steps as illustrated in FIG. 12 may be added, removed, replaced, rearranged and repeated.

Referring to FIG. 12. At step 1010, a wafer is formed on a carrier. The wafer comprises a plurality of IC devices in die regions of the wafer, and each IC device has a plurality of external connectors formed on a first side of the wafer away from the carrier. At step 1020, the wafer is flipped over, and the external connectors and inactive regions on the first side of the wafer are attached to a tape. At step 1030, the carrier is de-bonded from the wafer. At step 1040, center portions of the tape attached to the external connectors are removed. At step 1050, solder paste is formed in openings on a second side of the wafer opposite the first side. The openings expose conductive features of the wafer on the second side of the wafer. At step 1060, a plurality of top packages is aligned with corresponding IC devices of the wafer, and a reflow process is performed to bond the top packages with the wafer. At step 1070, residues from the reflow process are cleaned and underfill is formed between the top packages and the wafer. At step 1080, the top packages are attached to a coupling device. At step 1090, dicing is performed from the first side of the wafer.

In some embodiments, a method of packaging semiconductor devices comprises attaching a first substrate to a film. A first portion of the film is attached to a first region of the first substrate and a second portion of the film is attached to a second region of the first substrate. The method further comprises separating the first portion of the film from the second portion of the film.

In other embodiments, a method of packaging semiconductor devices includes forming a first substrate having a first region and a second region. The first region comprises a plurality of external connectors on a first side of the first substrate, and the second region is free of external connectors. The method further includes attaching the plurality of external connectors and the second region on the first side of the first substrate to a first tape, and removing a first portion of the first tape that is attached to the plurality of external connectors. A second portion of the first tape remains after the removing the first portion.

In yet other embodiments, a method of forming PoP packages comprises forming a substrate comprising an active region and an inactive region. The active region comprises a plurality of bottom packages and a plurality of external connectors on a first side of the substrate, and the inactive region is free of external connectors. The method includes attaching the plurality of external connectors and the inactive region on the first side of the substrate to a first film, removing a first portion of the first film attached to the plurality of external connectors, and after the removing the first portion of the first film, performing a reflow process to bond a plurality of top packages to corresponding ones of the bottom packages. The method further includes after the reflow process, attaching the top packages to a support, and dicing the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging semiconductor devices, the method comprising:
   attaching a first substrate to a film, wherein a first portion of the film is attached to external connectors in a first region of the first substrate and a second portion of the film is attached to a second region of the first substrate; and
   removing the first portion of the film from the first region of the first substrate, wherein the second portion of the film is attached to the second region of the first substrate after the removing.

2. The method of claim 1, wherein the removing the first portion of the film comprises:
   cutting the film around a border between the first region and the second region of the first substrate; and after the cutting the film, removing the first portion of the film attached to the external connectors.

3. The method of claim 1, wherein the first substrate comprises a plurality of semiconductor devices in the first region and no semiconductor device in the second region.

4. The method of claim 3, wherein the plurality of semiconductor devices comprises dies embedded in molding compound, vias extending through the molding compound, a back-side redistribution layer on a first side of the dies, and a front-side redistribution layer on a second side of the dies opposite the first side.

5. The method of claim 1, further comprising:
after the removing the first portion of the film, performing a heating process.

6. The method of claim 1, further comprising:
bonding a second substrate to a first side of the first substrate; and
dicing from a second side of the first substrate, wherein the first side is opposite the second side.

7. The method of claim 6, wherein the dicing is performed without removing the second portion of the film.

8. The method of claim 6, further comprising:
after the bonding the second substrate to the first substrate and before the dicing, attaching the second substrate to another film.

9. The method of claim 6, further comprising:
after the bonding the second substrate to the first substrate and before the dicing, attaching the second substrate to a chuck.

10. The method of claim 9, wherein the second substrate is attached to the chuck by vacuum.

11. A method of packaging semiconductor devices, the method comprising:
forming a first substrate having a first region and a second region, the first region comprising a plurality of external connectors on a first side of the first substrate, the second region being free of external connectors;
attaching the plurality of external connectors and the second region on the first side of the first substrate to a first tape; and
removing a first portion of the first tape, the first portion being attached to the plurality of external connectors, wherein a second portion of the first tape remains after the removing the first portion.

12. The method of claim 11, wherein the removing the first portion of the first tape comprises:
cutting the first tape around a perimeter of the external connectors; and
after the cutting the first tape, removing the first portion of the first tape attached to the external connectors.

13. The method of claim 11, further comprising:
bonding a second substrate to the first substrate;
attaching the second substrate to a support; and
dicing the first substrate.

14. The method of claim 13, wherein the support is a second tape.

15. The method of claim 13, wherein the support is a chuck.

16. A method of forming package-on-package (PoP) packages, the method comprising:
forming a substrate comprising an active region and an inactive region, wherein the active region comprises a plurality of bottom packages and a plurality of external connectors, wherein the inactive region is free of external connectors;
attaching the plurality of external connectors and the inactive region to a first film;
removing a first portion of the first film attached to the plurality of external connectors, wherein after the removing, a second portion of the first film remains attached to the inactive region;
after the removing the first portion of the first film, performing a reflow process to bond a plurality of top packages to corresponding ones of the bottom packages;
after the reflow process, attaching the top packages to a support; and
dicing the substrate.

17. The method of claim 16, further comprising:
before the removing the first portion of the first film, cutting the first film along a perimeter of the external connectors.

18. The method of claim 17, wherein the cutting the first film is performed using laser.

19. The method of claim 16, wherein the support is a chuck.

20. The method of claim 16, wherein the support is a second film.

* * * * *